United States Patent
Miyashiro et al.

(10) Patent No.: US 11,225,990 B2
(45) Date of Patent: Jan. 18, 2022

(54) JOINING STRUCTURE OF THIN METAL PLATE AND BASE MATERIAL, AND WELDING METHOD OF THIN METAL PLATE AND BASE MATERIAL

(71) Applicant: NIPPON MEKTRON, LTD., Tokyo (JP)

(72) Inventors: Hiroshi Miyashiro, Tokyo (JP); Yoichi Suruga, Tokyo (JP); Shuhei Koyano, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 1034 days.

(21) Appl. No.: 15/876,234

(22) Filed: Jan. 22, 2018

(65) Prior Publication Data

US 2018/0335060 A1    Nov. 22, 2018

(30) Foreign Application Priority Data

May 22, 2017    (JP) .............................. JP2017-100605

(51) Int. Cl.
  *B23K 26/26*    (2014.01)
  *F16B 5/08*    (2006.01)
  *B23K 26/244*    (2014.01)
  *B23K 26/28*    (2014.01)

(52) U.S. Cl.
  CPC .............. *F16B 5/08* (2013.01); *B23K 26/244* (2015.10); *B23K 26/26* (2013.01); *B23K 26/28* (2013.01)

(58) Field of Classification Search
  CPC ........ B23K 26/20; B23K 26/22; B23K 26/26; B23K 26/28; B23K 26/244; B23K 26/348; B23K 26/082
  See application file for complete search history.

(56) References Cited

U.S. PATENT DOCUMENTS

| | | | |
|---|---|---|---|
| 7,910,855 B2 | 3/2011 | Dinauer et al. | |
| 10,118,249 B2 | 11/2018 | Solomon et al. | |
| 10,137,530 B2 | 11/2018 | Hisada et al. | |
| 2007/0084835 A1* | 4/2007 | Dinauer ................. | B23K 26/26 219/121.64 |
| 2009/0266801 A1* | 10/2009 | Oku ....................... | B23K 26/32 219/121.64 |
| 2014/0352835 A1* | 12/2014 | Lin ........................ | B23K 28/02 138/177 |
| 2015/0283648 A1 | 10/2015 | Hisada et al. | |
| 2017/0106470 A1 | 4/2017 | Solomon et al. | |

(Continued)

FOREIGN PATENT DOCUMENTS

| | | |
|---|---|---|
| CN | 101676060 A | 3/2010 |
| JP | S62-33086 A | 2/1987 |
| JP | 2011-173146 A | 9/2011 |

(Continued)

*Primary Examiner* — Daniel J Wiley
(74) *Attorney, Agent, or Firm* — Studebaker & Brackett PC

(57) ABSTRACT

A welding method includes overlapping a thin metal plate with a base material, and setting an annular welding schedule line on a welding schedule portion of the thin metal plate; forming a welding line such that a continuous irradiation with a laser light from a fiber laser is performed while moving the laser light along the welding schedule line, and while vibrating the laser light across the welding schedule line; and setting a length of the welding line such that an entire inside of the welding schedule line is welded.

5 Claims, 7 Drawing Sheets

WELDING DIRECTION

(56) References Cited

U.S. PATENT DOCUMENTS

2019/0070695 A1    3/2019   Hisada et al.

FOREIGN PATENT DOCUMENTS

| JP | 2012-125829 A | 7/2012 |
| JP | 2015-030011 A | 2/2015 |
| JP | 2015-047625 A | 3/2015 |
| JP | 2015-199097 A | 11/2015 |
| JP | 2017-052006 A | 3/2017 |
| WO | 2015/186168 A1 | 12/2015 |

* cited by examiner

WELDING DIRECTION

WELDING DIRECTION

JOINING STRUCTURE OF THIN METAL PLATE AND BASE MATERIAL, AND WELDING METHOD OF THIN METAL PLATE AND BASE MATERIAL

CROSS-REFERENCE TO RELATED APPLICATION

This application claims priority from Japanese Patent Application No. 2017-100605 filed with the Japan Patent Office on May 22, 2017, the entire content of which is hereby incorporated by reference.

BACKGROUND

1. Technical Field

This disclosure relates to a joining structure of a thin metal plate and a base material, and a welding method of the thin metal plate and the base material.

2. Description of the Related Art

Typically, joining members one another by laser welding is performed. For example, in a known method illustrated in FIG. 7A, a single-mode and continuous-wave fiber laser is used. An airtight battery container is seal-welded to a cover plate (see JP-A-2015-30011) in such a manner that an irradiation position 51 of the fiber laser is vibrated to cross a welding schedule line 52.

In a known method illustrated in FIG. 7B, a single-mode and continuous-wave fiber laser is used. Spot welding is performed (see JP-A-2015-47625) in such a manner that a laser irradiation position 61 is moved in a spiral shape centering a spot welding position 63.

Furthermore, the following welding method is known (see JP-A-2011-173146). This method includes a main welding process and a concurrent heating process. In the main welding process, irradiation with a high-heat-input laser light configured to weld laminated metal plates one another is performed in the spiral shape from a center of a welded portion toward an outer peripheral side. In the concurrent heating process, an outer peripheral portion of an irradiation range of the laser light in this main welding process is further irradiated with a laser light having a decreased input per unit time of the laser light to make an irradiation depth shallow. With these processes, between a molten metal and its surrounding metal of the welded portion in the main welding process, a molten metal to secure them increases to restrain welding failure.

SUMMARY

A welding method includes overlapping a thin metal plate with a base material, and setting an annular welding schedule line on a welding schedule portion of the thin metal plate; forming a welding line such that a continuous irradiation with a laser light from a fiber laser is performed while moving the laser light along the welding schedule line, and while vibrating the laser light across the welding schedule line; and setting a length of the welding line such that an entire inside of the welding schedule line is welded.

DESCRIPTION OF THE EMBODIMENTS

Figure 1:
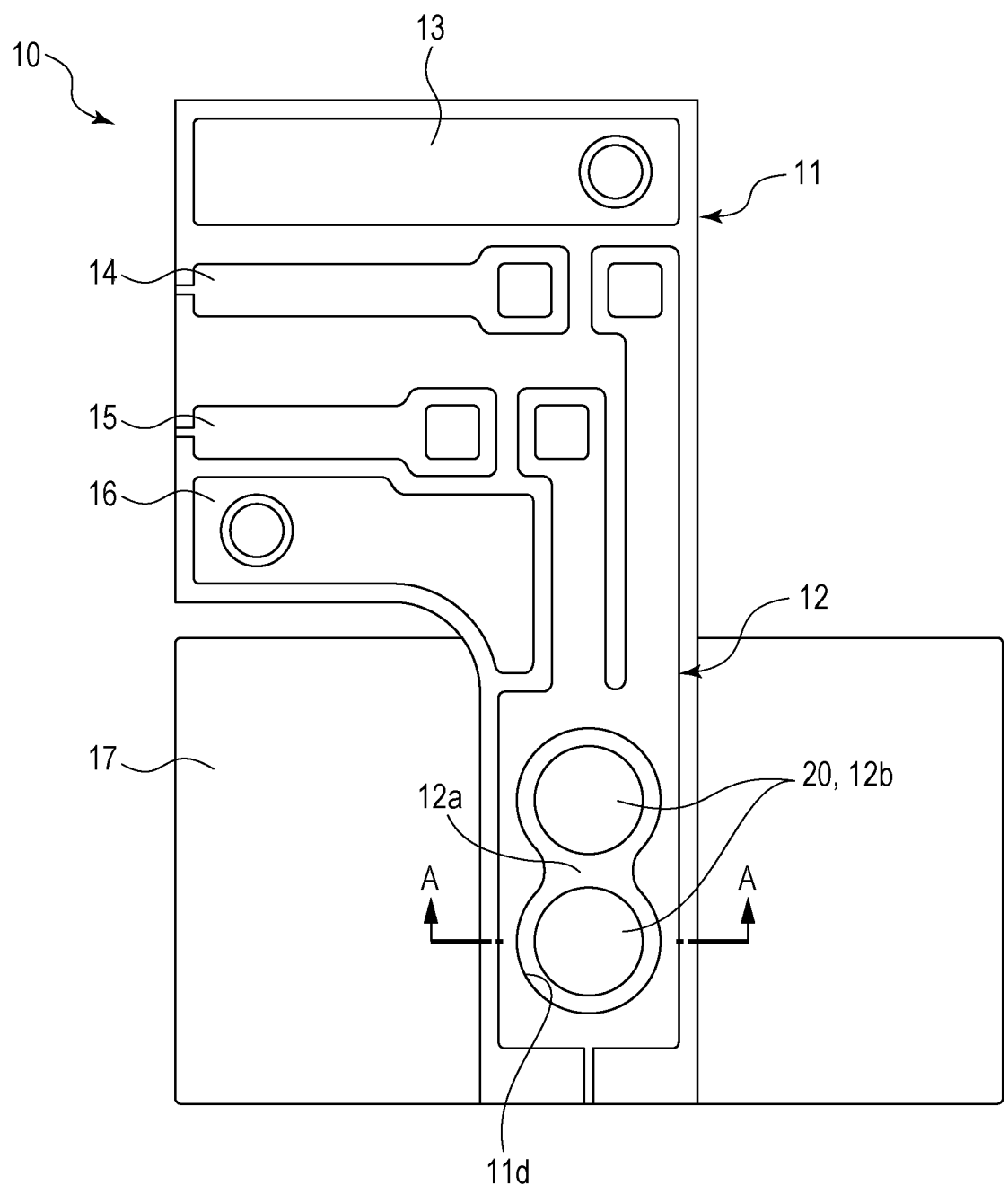
FIG. 1 is a plan view of a joining structure of a flexible circuit board and a busbar according to a first embodiment of this disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

However, the welding methods disclosed in JP-A-2015-30011, JP-A-2015-47625, and JP-A-2011-173146 premise that there is no large difference in plate thicknesses of two members that will be welding objects. However, there is a case where there is a large difference in the plate thicknesses of the two members that will be the welding objects, for example, a case where a copper foil (about 35 µm) disposed on an insulating film is welded to a busbar (about 1.5 mm), such as a printed circuit board.

In the technique in JP-A-2015-30011, a welding strength in a direction along the welding schedule line 52 is significantly different from a welding strength in a direction perpendicular to the welding schedule line 52. That is, in this technique, the welding strength significantly differs depending on a direction of an external force acting on the welded portion. However, since the printed circuit board flexibly significantly deforms in all directions, the external force from all directions also acts on the welded portion. Therefore, in this technique, it is difficult for the welded portion to provide a sufficient joining strength (welding strength). When two members are attempted to be sufficiently blended into one another to cause the welded portion to provide the sufficient welding strength, the copper foil on the printed circuit board burns through, thus making the joining difficult.

In contrast, in the technique in JP-A-2015-47625, the welding is performed while moving the irradiation position 61 of the laser light in the spiral shape. Therefore, an asymmetry property of the welding strength in accordance with the technique in JP-A-2015-30011 can be improved. However, in the technique in JP-A-2015-47625, the welding objects are joined to one another only by a spiral welding line portion 62. Hence, it is difficult to obtain a sufficient welding length. To make the welding length long, it is necessary to increase a diameter of the spiral shape. Therefore, this technique is not appropriate to the joining of the copper foil having a narrow width, such as the printed circuit board. In this technique, a peripheral area of a final end 64 of the welding line is opened. Hence, when the external force acts on the welding object, the external force concentrates on the final end 64 of the welding line to possibly generate a crack at the proximity of the final end 64.

In contrast, in the technique in JP-A-2011-173146, in the concurrent heating process, between the welded portion welded in the spiral shape and its surrounding metal, the molten metal to secure them is increased. Therefore, the concentration of the external force on a welding end portion in accordance with the technique in JP-A-2015-47625 can be reduced. However, even in the technique in JP-A-2011-173146, in the main welding process, only the part welded in the spiral shape is mainly joined. Hence, the sufficient welding length is not obtained. In the concurrent heating process, the heat input that is input per unit time of the laser light is decreased to make the irradiation depth shallow. Therefore, the sufficient blending of the spiral welding end portion and its surrounding metal is less likely to be obtained, thus possibly not realizing the sufficient welding strength.

In addition, when the techniques in JP-A-2015-30011, JP-A-2015-47625, and JP-A-2011-173146 are applied to the welding of the copper foil and the busbar of the printed circuit board, an insulator that insulates the copper foil, of the printed circuit board is damaged by heat in welding.

An object of the present disclosure is to provide a joining structure and a laser welding method that can provide a joining strength even when an external force acts from any direction.

A welding method according to one aspect of the present disclosure (the present welding method) includes: overlapping a thin metal plate with a base material, and setting an annular welding schedule line on a welding schedule portion of the thin metal plate; forming a welding line such that a continuous irradiation with a laser light from a fiber laser is performed while moving the laser light along the welding schedule line, and while vibrating the laser light across the welding schedule line; and setting a length of the welding line such that an entire inside of the welding schedule line is welded.

With the present welding method, the continuous irradiation with the laser light is performed while the laser light moves along the welding schedule line and vibrates across the welding schedule line to form a plurality of welding lines. Accordingly, the welding length can be made long. In the present welding method, a welding position is annularly formed, and the whole of its inside is welded. This allows the welding line to provide the joining strength even when the external force acts from any direction.

This welding method may further include use of a single-mode fiber laser as the fiber laser.

In the single-mode fiber laser, the size of a beam spot is significantly narrowed down to ensure concentration of the laser light on one point. This ensures the heat input on the beam spot without excessively increasing a laser output power. As a result, even when the welding is performed on a member having a thin thickness, occurrence of strain can be restrained.

In the present welding method, the setting of the welding schedule line may include coaxially setting a plurality of the welding schedule lines, and the setting of the length of the welding line may include setting the length of the welding line to a length to restrain a welding line regarding the outer welding schedule line from overlapping a welding line regarding the inner welding schedule line.

With this configuration, the double welding lines that are annularly continuous are concentrically formed along the plurality of welding schedule lines. Therefore, the welding line can provide higher welding strength without having a directionality.

The forming of the welding line may include forming the welding line such that the adjacent welding lines contact or overlap one another in a direction along the welding schedule line.

With this configuration, the welding is performed such that an approximately entire surface of a welded area has an approximately uniform welding depth. Therefore, the welding line can provide higher welding strength without having the directionality.

The present welding method may further include: coating the thin metal plate with an insulator; and removing the insulator on the welding schedule portion of the thin metal plate.

With this configuration, a quality of the welded portion can be stabilized.

A joining structure according to one aspect of the present disclosure (the present joining structure) includes a joining portion of a thin metal plate and a base material. The joining portion includes an annular welding line group, the annular welding line group includes a plurality of welding lines arranged along a circumferential direction of the annular welding line group, and the welding line has a length set such that an entire inside of the joining portion is welded.

With this joining structure, the welding lines having a length that can join the thin metal plate to the base material are arranged in the circumferential direction, and the entire joining portion includes the welded annular welding line group. Thus, the joining can provide the welding strength even when the external force acts from any direction.

In this joining structure, a plurality of the annular welding line groups may be approximately concentrically arranged.

With this configuration, since the plurality of annular welding line groups is approximately concentrically arranged, the joining strength of the thin metal plate and the base material can be further enhanced.

In this joining structure, the welding lines adjacent in the circumferential direction of the annular welding line group may contact or overlap one another.

With this configuration, the welding is performed such that an approximately entire surface of the joining portion has an approximately uniform welding depth. Therefore, the joining portion can provide higher welding strength without having the directionality.

First Embodiment

A configuration for performing a joining structure and a welding method according to this disclosure will be described in detail by referring to the drawings. However, the technique in this disclosure is not limitedly interpreted as these embodiments. To these embodiments, various kinds of changes, modifications, and improvement can be added based on the knowledge of those skilled in the art, without departing from the technique range in this disclosure.

A joining structure and a welding method according to this embodiment will be described with reference to FIGS. 1, 2, 3, 4A and 4B. As illustrated in FIG. 1, the joining structure according to this embodiment includes a flexible circuit board 10 and a busbar 17. The flexible circuit board 10 is joined to the busbar 17 by a joining portion 20. The flexible circuit board 10 corresponds to an exemplary thin metal plate according to this disclosure. The busbar 17 corresponds to an exemplary base material according to this disclosure.

The joining portion 20 is formed such that a welding schedule portion (a board welding schedule portion 12*b*) of the flexible circuit board 10 is joined to a welding schedule portion (a busbar welding schedule portion 17*b*) of the busbar 17 by welding. That is, the joining portion 20 includes the board welding schedule portion 12*b* and the busbar welding schedule portion 17*b* joined to one another. The board welding schedule portion 12*b* is a part of the flexible circuit board 10, and this part is melted with the laser light in welding to form the joining portion 20. The busbar welding schedule portion 17*b* is a part of the busbar 17, and this part is melted with the laser light in welding to form the joining portion 20.

The joining structure illustrated in FIG. 1 includes two joining portions 20. However, the number of the joining portions 20 is not limited to two. For example, the number of the joining portions 20 may be one, three, or four or more depending on the size of current flowing through the joining portion 20.

Figure 2:
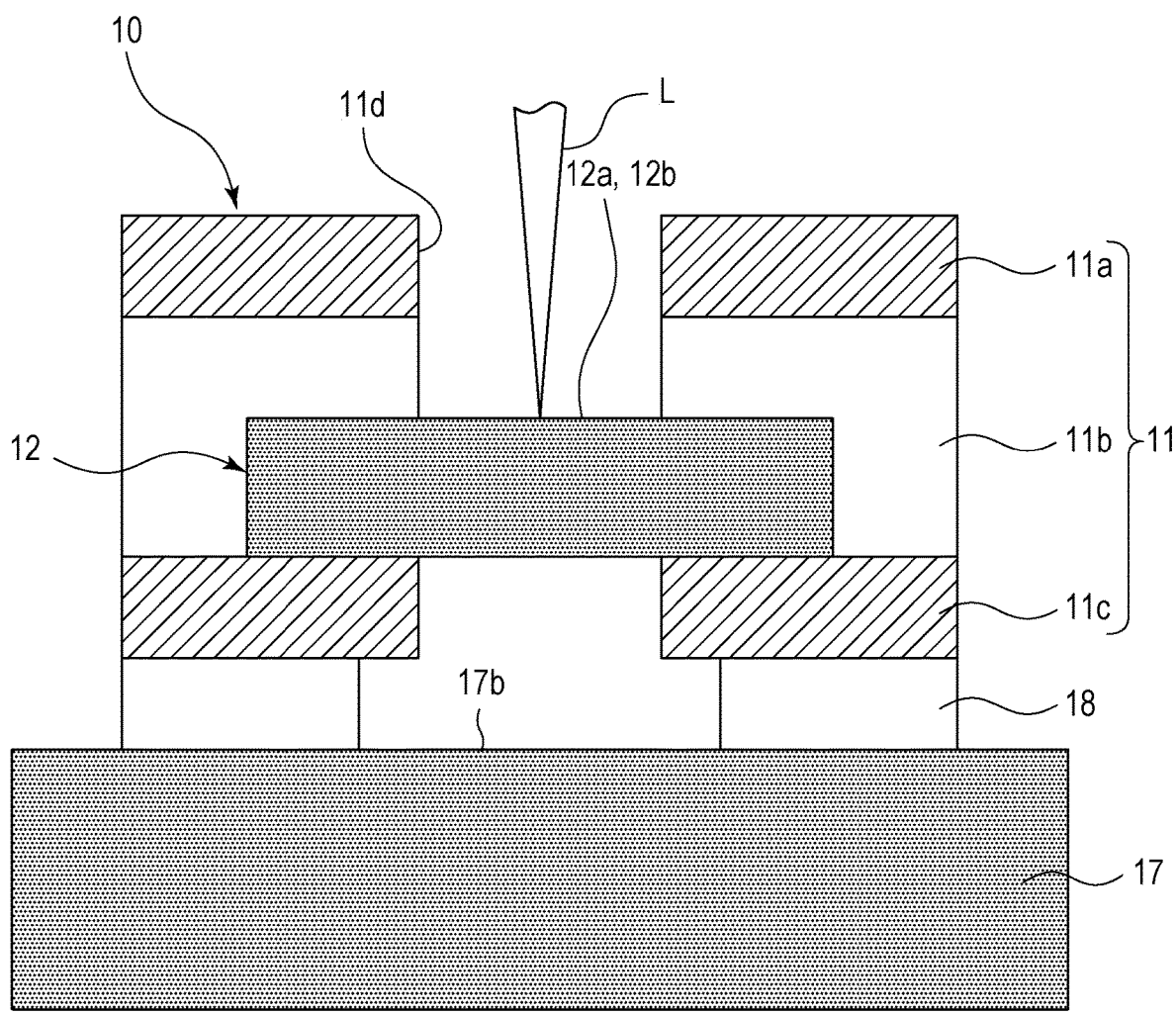
FIG. 2 is a view on arrow A-A in FIG. 1, and illustrates a welding state of the flexible circuit board and the busbar.

As illustrated in FIGS. 1 and 2, the flexible circuit board 10 includes a thin and soft base film 11 having an insulation property, and copper foil portions 12, 13, 14, 15, and 16 that constitute an electric circuit formed on the base film 11. The copper foil portions 12, 13, 14, 15, and 16 correspond to exemplary metal foils according to this disclosure. The flexible circuit board 10 has a pattern of the electric circuit already formed. Therefore, use of the flexible circuit board 10 ensures power saving for a wiring work. The flexible circuit board 10 can be arranged in a slight gap of equipment since the flexible circuit board 10 is very thin and can be freely bended. Thus, the flexible circuit board 10 is used with freely bended. Hence, the external force acts on the joining portion 20 from all directions.

The base film 11 of the flexible circuit board 10 is formed of, for example, polyimide having a thickness with about 25 µm. The base film 11 includes a base material 11*c* and a cover material 11*a*. The copper foil portions 12, 13, 14, 15, and 16 of the flexible circuit board 10 are formed as follows. First, a copper foil having a thickness with about 35 µm is bonded on the base material 11*c* with an adhesive 11*b*. The copper foil portions 12, 13, 14, 15, and 16 that constitute a desired electrical circuit pattern are formed on the base material 11*c* in such a manner that a print technique is applied to this copper foil. Furthermore, the cover material 11*a* is bonded on the copper foil portions 12, 13, 14, 15, and 16. This cover material 11*a* insulates the copper foil portions 12, 13, 14, 15, and 16 that constitute the electric circuit. Furthermore, this cover material 11*a* protects and reinforces the very thin copper foil portions 12, 13, 14, 15, and 16.

The busbar 17 is formed of a metal having a conductive property. The metal that will be a material of the busbar 17 may be, for example, a copper plate having a thickness with about 1.5 mm. The flexible circuit board 10 is overlapped with the busbar 17 to be fixed with an adhesive 18. The flexible circuit board 10 (the board welding schedule portion 12*b*) is welded to the busbar 17 (the busbar welding schedule portion 17*b*) to form the joining portion 20 in such a manner that the board welding schedule portion 12*b* of the flexible circuit board 10 is irradiated with a laser light L.

Thus, the flexible circuit board 10 is welded to the busbar 17 in a state where the flexible circuit board 10 is fixed to the busbar 17 with the adhesive. This can reduce influence from the external force applied to the joining portion 20 in welding by the laser light. In the flexible circuit board 10, a position different from the board welding schedule portion 12*b* is also fixed to the busbar 17 with the adhesive. This ensures restraining of the external force added to the joining portion 20 after welding. Here, since the cover material 11*a* carbonizes when the copper foil portion 12 covered with the cover material 11*a* is irradiated with the laser light L, the satisfactory joining portion 20 is not obtained. Therefore, in the flexible circuit board 10, a part of the cover material 11*a* (the board welding schedule portion 12*b* (or a part of a cover member on the board welding schedule portion 12*b*)) is removed to form an opening 11*d* on the cover material 11*a*. This opening 11*d* forms a copper-foil exposed portion 12*a* that is an exposed copper foil portion including the board welding schedule portion 12*b*. The board welding schedule portion 12*b* of this copper-foil exposed portion 12*a* is directly irradiated with the laser light. The copper-foil exposed portion 12*a* corresponds to an exemplary metal exposed portion according to this disclosure. The board welding schedule portion 12*b* is, for example, a part corresponding to the joining portion 20 in the copper-foil exposed portion 12*a* illustrated in FIG. 2. The busbar welding schedule portion 17*b* is, for example, a part overlapping the board welding schedule portion 12*b* in the busbar 17.

The copper is categorized in a high reflective material with respect to the laser light. Therefore, when the general laser light is used, there is a possibility that the copper does not sufficiently absorb the laser light to make it difficult to realize an efficient welding. Therefore, as a laser to weld the copper, usually, a green laser is used. However, since continuous irradiation with the green laser is difficult, use of it deteriorates a productivity. With the green laser, an emission period of the laser light is short, a few msec. Hence, in welding, the laser output power is increased. However, when the board welding schedule portion 12*b* of the very thin copper foil portion 12 is irradiated with the laser light having a high laser output power, the board welding schedule portion 12*b* burns through, thus causing a possibility that the satisfactory joining portion 20 is not obtained.

Therefore, in this embodiment, as a laser for welding the copper that is the high reflective material, a single-mode fiber laser that ensures continuous irradiation is used. In the single-mode fiber laser, a strength of a laser beam has one peak in an irradiation area. In the single-mode fiber laser, such that the size of the beam spot is narrowed down to about a few 100 µm to 500 µm to concentrate the laser light on a single point, the continuous irradiation with the laser light can be performed. Therefore, without excessively increasing the laser output power, the heat input on the beam spot is ensured.

Accordingly, use of the single-mode fiber laser light can perform the welding with a low strain even on a member having a very thin thickness, such as the copper foil portion 12 of the flexible circuit board 10. The heat input to the board welding schedule portion can be reduced. This can restrain the damage of the board welding schedule portion 12*b*, and can restrain the damage of the cover material 11*a* that insulates the copper foil portion 12. Furthermore, the use of the single-mode fiber laser light can contactlessly weld the board welding schedule portion 12*b* and the busbar welding schedule portion 17*b*. Therefore, even when a small joining portion having a diameter with about 3 mm is formed, such as the joining portion 20, the laser light L is sent into the board welding schedule portion 12*b* (and the busbar welding schedule portion 17*b*) to ensure formation of a complicated welding line.

Figure 3:
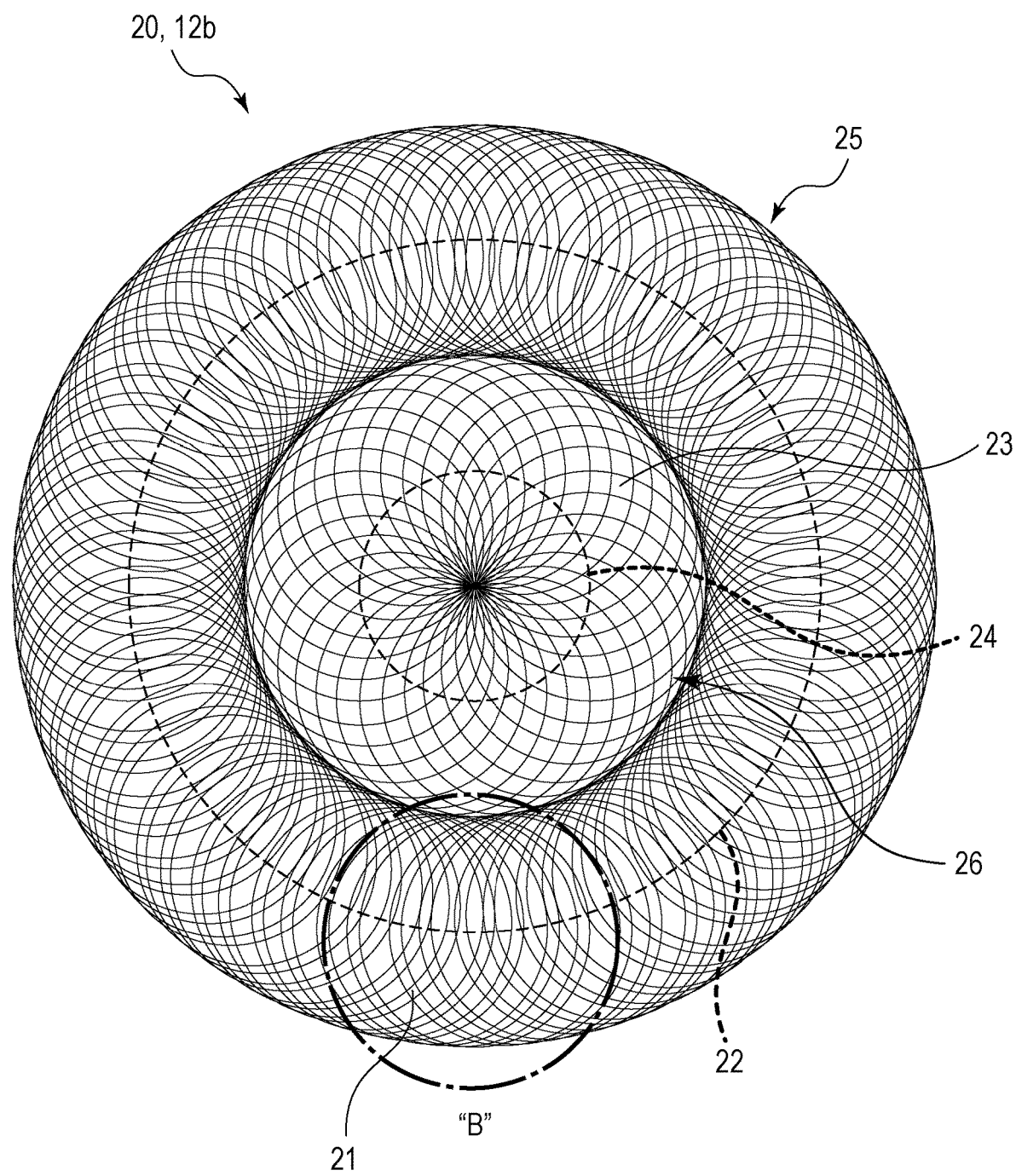
FIG. 3 illustrates an example that welding is performed using two annular welding line groups.

The following describes a shape of the welding line. The welding line corresponds to the trajectory of the laser light L with which the board welding schedule portion 12b (and the busbar welding schedule portion 17b) is irradiated. As illustrated in FIG. 3, on the board welding schedule portion 12b (the joining portion 20), an approximately round welding schedule line 22, and an approximately round welding schedule line 24 whose diameter is smaller than that of this welding schedule line 22 are approximately concentrically arranged (set). Insofar as the welding schedule line 22 and the welding schedule line 24 are closed annular figures, their shapes are not limited to be round.

The continuous irradiation with the laser light L is performed while the laser light L moves along the welding schedule line 22, and while the laser light L vibrates across the welding schedule line 22 to form a welding line 21. Similarly, the continuous irradiation with the laser light L is performed while the laser light L moves along the welding schedule line 24, and while the laser light L vibrates across the welding schedule line 24 to form a welding line 23.

The welding line 21 (an outer welding line) has a radial length (a length of the welding line 21) set, for example, to weld almost all of an inside of the welding schedule line 22, a part not overlapping the welding line 23 (an inner welding line). The welding line 23 has a radial length (a length of the welding line 23) set, for example, to weld almost all of an inside of the welding schedule line 24. Here, the radial lengths of the welding lines 21 and 23 are set such that the welding line 21 does not overlap the welding line 23, or such that overlapping of the welding line 21 with the welding line 23 becomes minimum. That is, the radial lengths of the welding lines 21 and 23 are set to restrain (or avoid) the welding line 21 and the welding line 23 from overlapping one another.

An annular welding line group 25 including a plurality of welding lines 21 is formed in such a manner that the laser light L circles one time along the welding schedule line 22 while vibrating across the welding schedule line 22. An annular welding line group 26 including a plurality of welding lines 23 is formed in such a manner that the laser light L circles one time along the welding schedule line 24 while vibrating across the welding schedule line 24. Accordingly, at least an approximately whole of the insides of the welding schedule lines 22 and 24 are welded, and the joining portion 20 is formed.

In this embodiment, as illustrated in FIG. 3, the radial lengths of the welding lines 21 and 23 are set to restrain the welding line 21 and the welding line 23 from overlapping one another, and such that the whole of the joining portion 20 is welded (the welding line 21 or the welding line 23 refers to the approximately whole of the joining portion 20).

In this embodiment, even when the external force acts on the joining portion 20 from any direction, the joining portion 20 (the welding lines 21 and 23) can provide the welding strength, for example actually equally. That is, the joining portion 20 can provide the welding strength without having the directionality.

In this embodiment, at least, the above-described approximately whole of the insides of the welding schedule lines 22 and 24 is welded. This "approximately whole" has the gist that it may be whole, or a non-welded portion may remain. That is, the above-described overlapping may be set as small as possible to restrain burn-through of the joining portion 20 (the board welding schedule portion 12b) such that the welding lines 21, the welding lines 23, or the welding line 21 and the welding line 23 densely overlap one another. Thus, the non-welded portion sometimes remains.

Figure 4A:
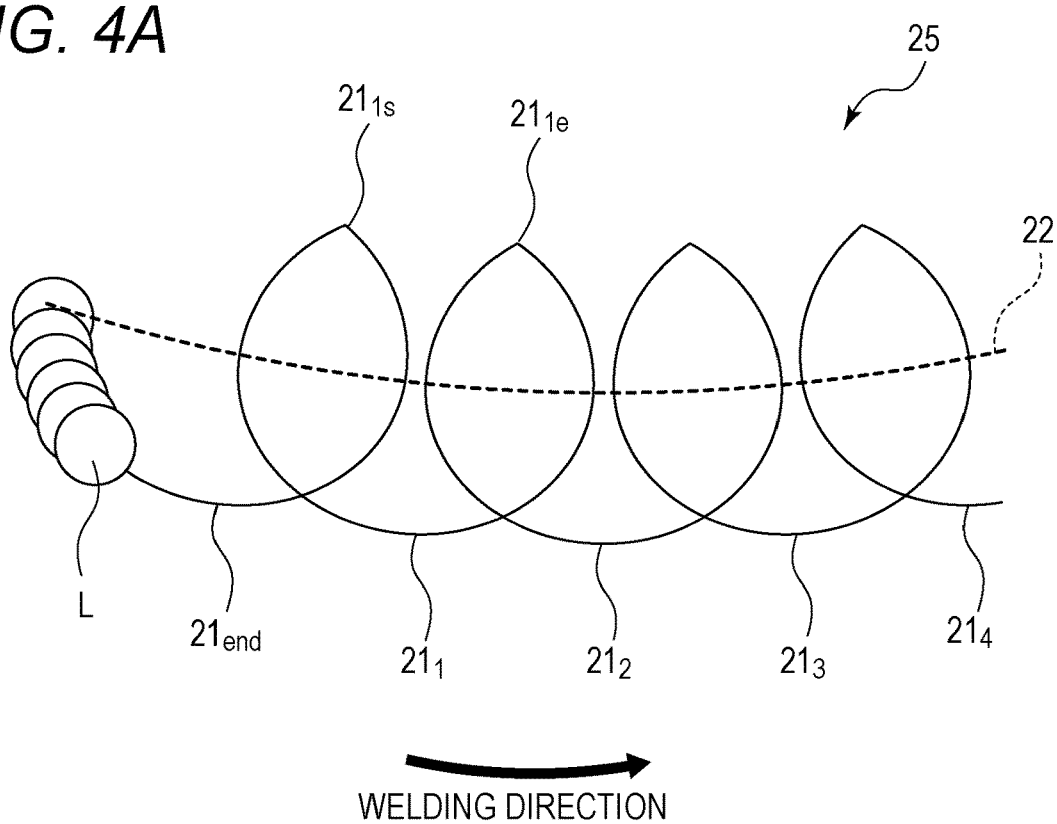
FIG. 4A illustrates a method that performs irradiation with the laser light to perform the welding, while continuously drawing an approximately round trajectory along a welding schedule line.

Here, the annular welding line group 25 has a configuration similar to a configuration of the annular welding line group 26. The following describes the configuration of the annular welding line group 25 as one example. As illustrated in FIG. 4A, the approximately round welding schedule line 22 is set on the board welding schedule portion 12b (the copper-foil exposed portion 12a) of the flexible circuit board 10. The continuous irradiation with the laser light L is performed while the laser light L moves along this welding schedule line 22. Furthermore, the laser light L is vibrated to cross the welding schedule line 22. Accordingly, the annular welding line group 25 is formed such that arc-shaped welding lines $21_1$, $21_2$, $21_3$, $21_4$, ..., and $21_{end}$ are adjacent in a circumferential direction of the annular welding line group 25 to be annularly continuous (arranged along the circumferential direction).

Here, a description will be given focusing on one welding line $21_1$ in the annular welding line group 25. When it is assumed that a welding direction of the annular welding line group 25 is counterclockwise, the welding line $21_1$ is formed to overlap a part of the welding line $21_2$ adjacent on a side of a terminating end $21_{1e}$ of the welding line $21_1$, and a part of the welding line $21_{end}$ adjacent on a side of a starting end $21_{1s}$ of the welding line $21_1$.

Here, a radius of the laser light L is preferred to be smaller than a moving amount to an internal diameter direction or an external diameter direction of the laser light L when the laser light L vibrates across the welding schedule line 22. This moving amount is a maximum moving amount to one direction (the internal diameter direction or the external diameter direction) that is perpendicular to the welding schedule line 22 on the welding line 21. This can restrain a position constantly irradiated with the laser light L from occurring. As a result, this can restrain heat from being excessively applied to a part of the welding position.

Thus, the welding line $21_1$ has parts (overlapping portions) overlapping the adjacent welding line $21_2$ and welding line $21_{end}$. Thus, the welding line $21_1$, and the welding line $21_2$ and the welding line $21_{end}$ are reinforced one another to ensure dispersion of the external force. This can enhance the joining strength of the joining portion 20. After welding, the busbar 17 deprives the welding line $21_1$ of heat, and then, the welding line $21_1$ is rapidly cooled. This becomes a cause that generates welding strain on the welding line $21_1$. However, the welding line $21_1$ has the overlapping portions overlapping the adjacent welding line $21_2$ and welding line $21_{end}$. Therefore, the welding line $21_1$ is heated again, thus also obtaining an advantageous effect that can restrain the welding strain.

Figure 4B:
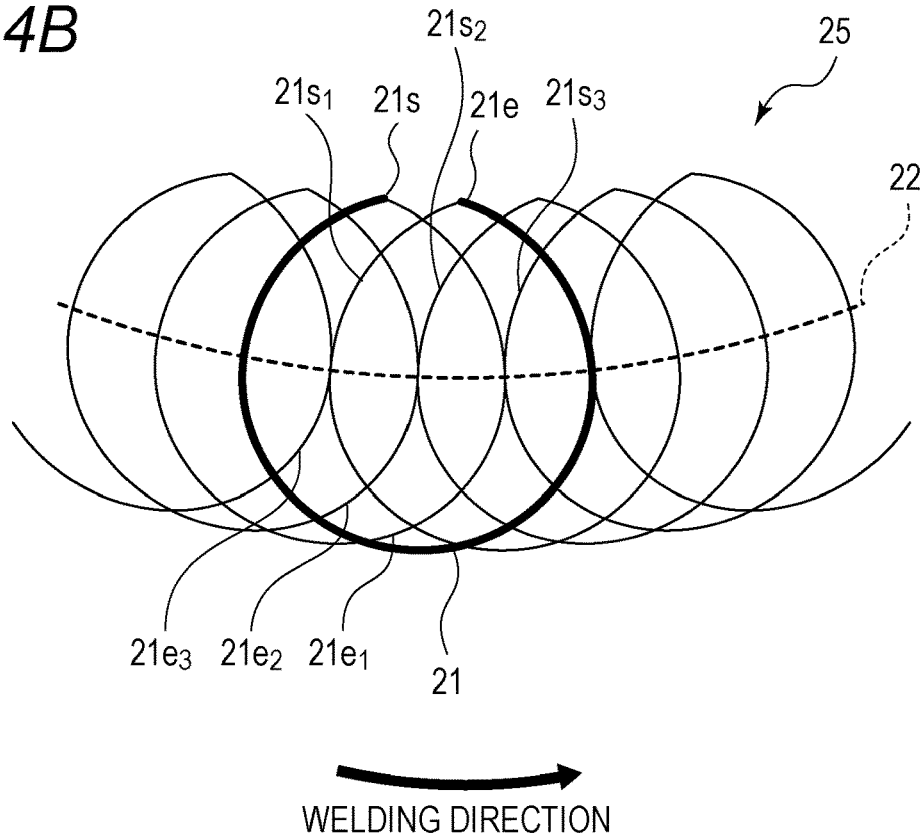
FIG. 4B illustrates a method that increases a density of an approximately round welding line to perform the welding.

As illustrated in FIG. 4B, the welding line 21 may have more overlapping portions with adjacent welding lines. For example, the welding may be performed such that three welding lines $21s_1$, $21s_2$, and $21s_3$ that are adjacent on a side of a terminating end $21e$ of the welding line 21, and three welding lines $21e_1$, $21e_2$, and $21e_3$ that are adjacent on a side of a starting end $21s$ of the welding line 21 intersect with the welding line 21. Thus, the welding line 21 has six pieces of overlapping portions with the adjacent welding line $21s_1$, $21s_2$, $21s_3$, $21e_1$, $21e_2$, and $21e_3$. Thus, the welding lines 21, $21s_1$, $21s_2$, $21s_3$, $21e_1$, $21e_2$, and $21e_3$ reinforce one another with tangled in a mesh shape. As a result, the joining strength can be further enhanced. The plurality of adjacent welding lines 21, $21s_1$, $21s_2$, $21s_3$, $21e_1$, $21e_2$, and $21e_3$ is heated again with one another's welding heat. This can restrain the welding strain of these welding lines.

As illustrated in FIG. 4B, the welding line 21 has six pieces of overlapping portions with the adjacent welding lines $21s_1$, $21s_2$, $21s_3$, $21e_1$, $21e_2$, and $21e_3$. The welding line 21 can be caused to intersect with more adjacent welding lines. However, when the number of other welding lines intersecting with one welding line is 12 or more, the improvement in an adhesion strength of the joining portion 20 hardly increase.

As described above, the joining structure in the first embodiment includes the joining portion 20 having the annular welding line group (circular welding line group) 25 and the annular welding line group (circular welding line group) 26. The circular welding line group 25 has the plurality of welding lines 21 formed annularly and continuously in the circumferential direction. The plurality of welding lines 21 is continuously formed such that the laser light L moves along the welding schedule line 22 (the first welding schedule line 22) and vibrates across the welding schedule line 22. The circular welding line group 26 has the plurality of arc-shaped welding lines 23 formed annularly and continuously in the circumferential direction. The plurality of welding lines 23 is continuously formed such that the laser light moves along the welding schedule line 24 (the second welding schedule line 24) and vibrates across the welding schedule line 24. Accordingly, the inside of the joining portion 20 is almost filled up with the annular welding line group 25 having the welding lines 21 tangled one another and the annular welding line group 26 having the welding lines 23 tangled one another. Therefore, the joining portion 20 joins the copper foil portion 12 to the busbar 17 with a high adhesion strength. Furthermore, the welding lines 21 and 23 are heated again in the process that the welding lines 21 and 23 overlap one another multiple times to ensure restraining of the welding strain.

In addition, it is preferable that adjacent welding marks (the welding lines 21 and 23) contact or overlap one another in a direction parallel to the welding schedule lines 22 and 24, that is, the circumferential directions of the annular welding line groups 25 and 26 (directions along the annular welding line groups 25 and 26). This can weld the whole of the joining portion 20 to make a welding depth of the joining portion 20 approximately uniform. Further, since the whole of the joining portion 20 is heated again, the welding strain can be restrained over the whole of the joining portion 20. An annular area having a width identical to a welding line width (that is, an annular area having an outer-peripheral-edge positive and negative welding line width) to cover outer peripheral edges of the annular welding line groups 25 and 26 (sandwich these outer peripheral edges from outside and inside) can be defined. In this annular area, such that one welding line and welding lines adjacent to this welding line contact or overlap one another, approximately whole of insides of the outer peripheral edges of the annular welding line groups 25 and 26 is welded on the joining portion 20. When the above-described welding line width varies, as a width of the annular area, the maximum welding line width may be employed.

In the example illustrated in FIG. 3, the joining portion 20 includes the two annular welding line groups 25 and 26. Depending on the size of the joining portion 20, the joining portion 20 may be configured to have three or four or more annular welding line groups.

Second Embodiment

Figure 5:
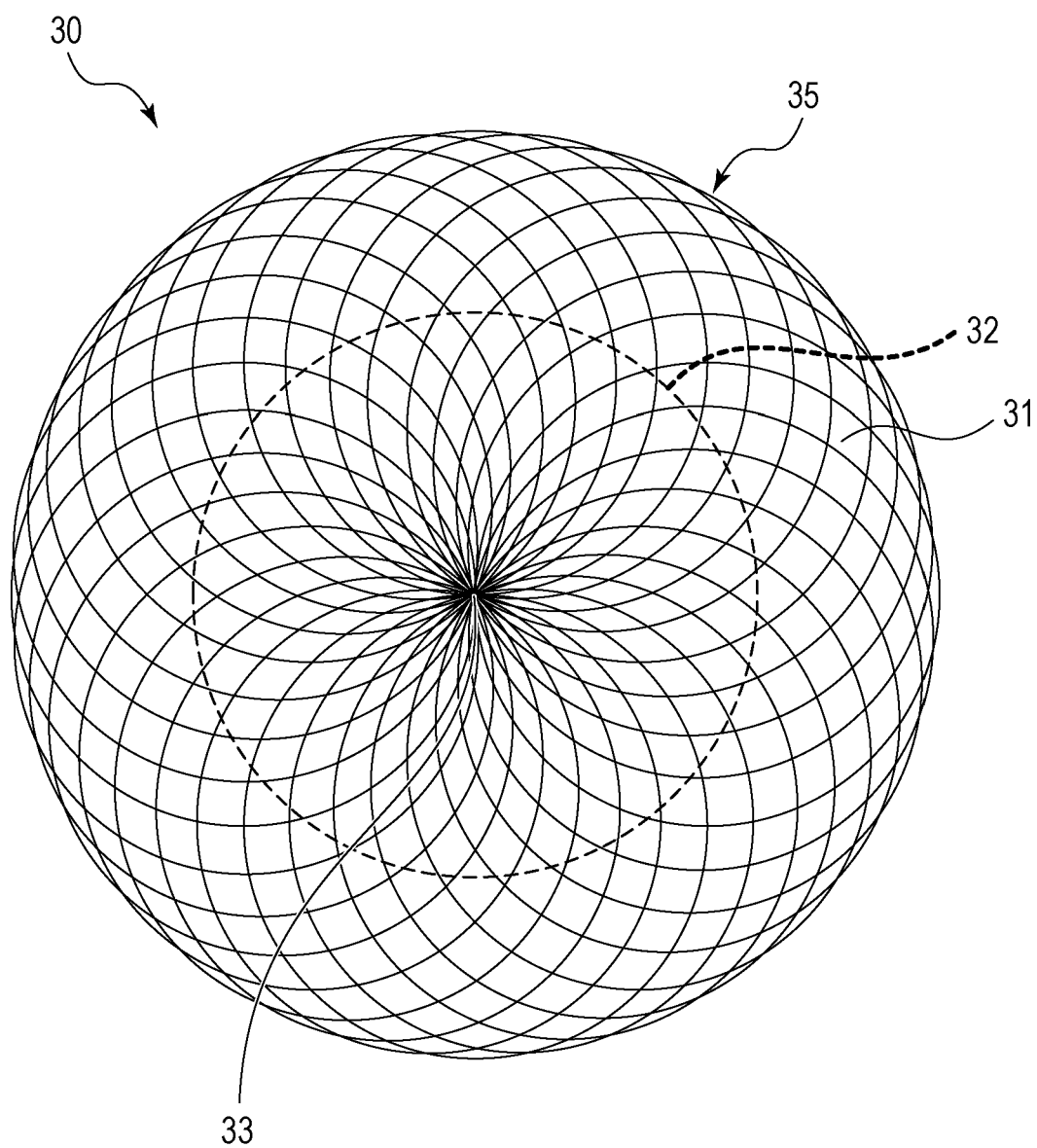
FIG. 5 illustrates an example that the welding is performed using one annular welding line group.

The following describes a configuration for performing a joining structure and a welding method according to a second embodiment with reference to FIG. 5. The joining structure in the first embodiment includes the joining portion 20 including the plurality of annular welding line groups 25 and 26. The joining structure in the second embodiment is different from that in the first embodiment in that a joining portion 30 includes one annular welding line group 35. In the following, identical reference numerals designate identical configurations in the first embodiment, and therefore overlapping explanation is omitted.

The joining portion 30, similarly to the joining portion 20, is formed such that the board welding schedule portion 12b is joined to the busbar welding schedule portion 17b by welding. As illustrated in FIG. 5, on the joining portion 30 according to the second embodiment, one approximately round welding schedule line 32 is set (arranged). The continuous irradiation with the laser light L is performed while the laser light L moves along the welding schedule line 32 and vibrates across the welding schedule line 32 to form a welding line 31. The welding line 31 has a radial length set such that approximately whole of an inside of the welding schedule line 32 can be welded. In this embodiment, as illustrated in FIG. 5, the radial length of the welding line 31 is set such that approximately whole of the joining portion 30 is welded (the welding line 31 refers to the approximately whole of the joining portion 30.

The laser light L (the welding line 31) circles one time along the welding schedule line 32 while vibrating across the welding schedule line 32 to form the annular welding line group 35. Thus, the approximately entire surface of the inside of the welding schedule line 32 is welded by the laser light L (the welding line 31) to form the joining portion 30. Therefore, the copper foil portion 12 is joined to the busbar 17 with the high adhesion strength. Furthermore, the welding line 31 is heated again in the process that the welding line 31 overlaps multiple times. This can restrain the welding strain of the welding line 31.

Here, the welding line 31 may refer to a center 33 of the annular welding line group 35. This can enhance the overall joining strength of the joining portion 30. To restrain burn-through of the joining portion 30 (the board welding schedule portion 12b) such that a plurality of welding lines 31 overlaps, considering a spot diameter of the laser light, a formation position of the welding line 31 may be adjusted such that the welding line 31 avoids passing through the center of the joining portion 30.

In this embodiment, at least, the above-described approximately whole of the inside of the welding schedule line 32 is welded. This "approximately whole" has the gist that it may be whole, or a non-welded portion may remain. That is, the above-described overlapping may be set as small as possible to restrain burn-through of the center of the joining portion 30 such that the welding lines 31 densely overlap one another. Thus, the non-welded portion sometimes remains. The welding schedule line 32 is usually set (arranged) to be positioned on an almost center of the welding line 31. However, it is not limited to this, and the welding schedule line 32 may be set (arranged) to be slanted toward one side of the welding line 31.

It is preferable that adjacent welding marks (welding lines 31) contact or overlap one another in a direction parallel to the welding schedule line 32, that is, a circumferential direction of the annular welding line group 35 (a direction along the annular welding line group 35). This can weld the whole of the joining portion 30 to make the welding depth of the joining portion 30 approximately uniform. Further, since the whole of the joining portion 30 is heated again, the welding strain can be restrained over the whole of the joining portion 30. An annular area having a width identical to a welding line width (that is, an annular area having an outer-peripheral-edge positive and negative welding line width) to cover an outer peripheral edge of the annular welding line group 35 (sandwich this outer peripheral edge from outside and inside) can be defined. In this annular area, such that one welding line and welding lines adjacent to this welding line contact or overlap one another, approximately whole of an inside of the outer peripheral edge of the annular welding line group 35 is welded on the joining portion 30. When the above-described width of the welding line 31 varies, as a width of the annular area, the maximum welding line width may be employed among widths of the welding line 31.

In the above, the embodiments of this disclosure have been described with the drawings. The specific configuration of the technique in this disclosure is not limited to these embodiments. The above-described embodiments may be changed, and other configurations or processes may be added to the above-described embodiments, in a range without departing from the gist of the technique in this disclosure.

For example, in the joining portion 20 (30) in the above-described embodiments, the circular welding line groups 25 and 26 (35) are formed such that the arc-shaped welding lines 21 and 23 (31) are continuously and adjacently formed along the approximately round welding schedule lines 22 and 24 (32). However, it is only necessary that the welding schedule line has a closed annular shape. The shape of the welding schedule line is not limited to be round, and may be elliptical, triangular, rectangular, or polygonal. In these cases, the annular welding line group, similarly to the welding schedule line, also may have an elliptical shape, a triangular shape, a rectangular shape, or a polygonal shape.

Figure 6:
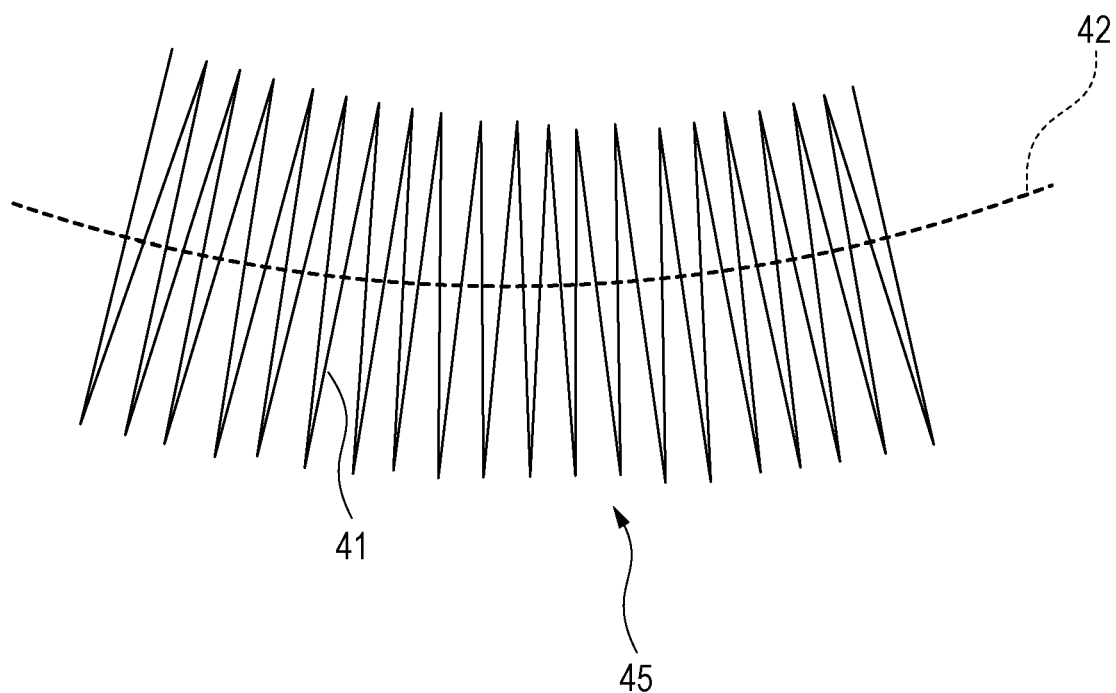
FIG. 6 is an explanatory view of a method that performs the irradiation with the laser light to perform the welding, while continuously drawing a linear trajectory along a welding schedule line.
Figure 7A:
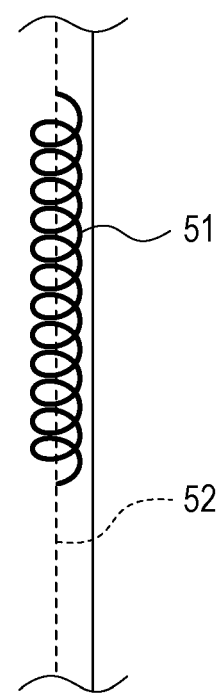
FIG. 7A illustrates a general method that performs the irradiation with the laser light in a spiral shape along a linear welding schedule line in a straight line to perform the welding.
Figure 7B:
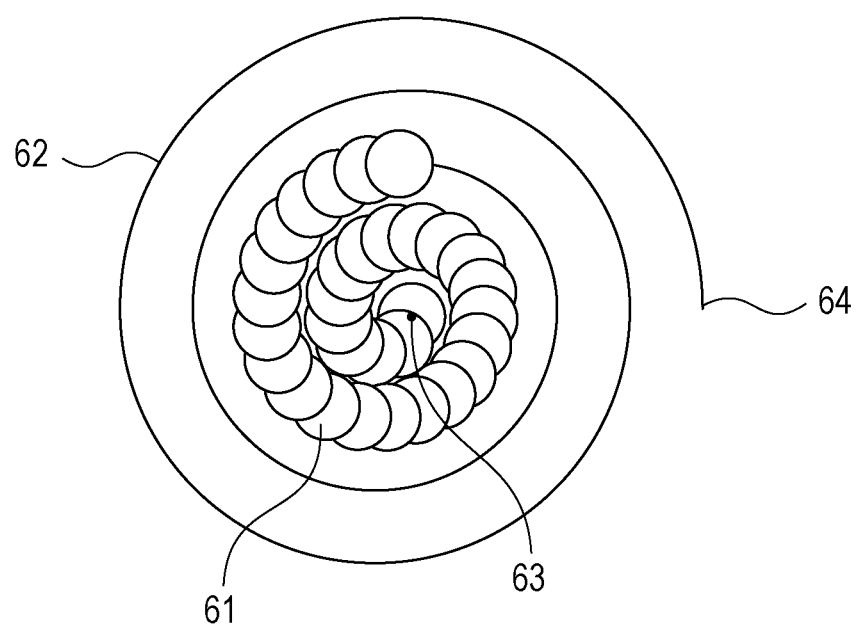
FIG. 7B illustrates a general method that performs the irradiation with the laser light along a spiral welding schedule line to perform the welding.

In the joining portion 20 (30) in the above-described embodiments, the arc-shaped welding lines 21 and 23 (31), and the circular welding line groups 25 and 26 (35) are formed. However, the shapes of the welding line and the welding line group are not limited to these. FIG. 6 illustrates a linear welding line 41 and an annular welding line group 45. In this view, for clarification, a part of the annular welding line group 45 is illustrated. As illustrated in this view, the annular welding line group 45 may be formed such that the laser light L circles one time along a welding schedule line 42 while vibrating across the annular welding schedule line 42 such that the linear welding line 41 is formed.

The linear welding line 41 has a length determined, for example, to weld approximately whole of an inside of the welding schedule line 42 depending on the size of the annular welding schedule line 42. This can weld the approximately whole of the inside of the welding schedule line 42. In this embodiment, the length (for example, a radial length) of the welding line 41 may be set such that approximately whole of the joining portion is welded (the welding line 41 refers to the approximately whole of the joining portion).

In FIG. 6, the welding schedule line 42 is usually set (arranged) to be positioned on an almost center in the radial direction of the welding line 41. However, it is not limited to this, and the welding schedule line 42 may be set (arranged) to be slanted toward one side of the welding line 41. In the example illustrated in FIG. 6, at least, the above-described approximately whole of the inside of the welding schedule line 42 is welded. This "approximately whole" has the gist that it may be whole, or a non-welded portion may remain. That is, to restrain burn-through of the joining portion such that the welding lines 41 densely overlap one another, the length of the welding line 41 is determined such that the welding line 41 does not reach an area of a center of the welding schedule line 42, and the non-welded portion sometimes remains in the center.

In the above-described embodiments, the material of the metal foil and the base material is copper. The material of the metal foil and the base material is not limited to this, and may be aluminum, argentum, or an SUS material. Alternatively, the material of the metal foil and the material of the base material may be mutually different. For example, the material of the metal foil may be copper, and the material of the base material may be aluminum. The material of the metal foil and the material of the base material may have any combination insofar as the desired performance is achieved.

In the above-described embodiments, the joining structure and the welding method regarding the welding of the flexible circuit board 10 and the busbar 17 are illustrated. The joining structure and the welding method according to the embodiment of this disclosure are not limited this, and may be applied to the welding of the thin metal plate such as diaphragm and bellows.

In the above-described embodiments, the welding schedule line is set on the board welding schedule portion 12b. Instead of this, the welding schedule line may be set on the busbar welding schedule portion 17b.

This disclosure may relate to especially, a joining structure of the flexible circuit board and the busbar having the metal foil portion coated with the insulator, and a welding method that welds the flexible circuit board and the busbar using the laser beam.

In the first embodiment, the joining portion 20 may be irradiated with the laser light L to weld the flexible circuit board 10 and the busbar 17. The welding lines 21 and 23 having the radial lengths that can weld almost whole of the insides of the respective welding schedule lines 22 and 24 may be set. The radial lengths of the welding lines 21 and 23 may be set such that the welding lines 21 and 23 do not overlap one another, or such that its overlapping is minimum.

The welding line $21_1$ may be welded such that a part of the welding line $21_2$ adjacent on the terminating end $21_{1e}$ side of the welding line 21, and a part of the welding line $21_{end}$ adjacent on the starting end $21_{1s}$ side overlap one another.

In the annular area having the respective welding line widths from the outer peripheral edges of the annular welding line groups 25 and 26 to outside and inside, that is, in the annular area having the outer-peripheral-edge positive and negative welding line width, the joining portion 20 where the approximately whole of the insides of the outer peripheral edges of the annular welding line groups 25 and 26 is welded such that one welding line and the welding lines adjacent to this one welding line contact or overlap one another may be formed. When the above-described welding line width varies, the maximum welding width among the widths of the welding line may be employed.

In the second embodiment, the continuous irradiation with the laser light L may be performed while the laser light L moves along the welding schedule line 32, and vibrates across the welding schedule line 32 to form the welding line 31. The welding line 31 may circle the welding schedule line 32 one time to form the annular welding line group 35. Thus, the welding line 31 welds over the approximately entire surface of the inside of the welding schedule line 32.

In the annular area having the respective welding line widths from the outer peripheral edge of the annular welding line group 35 to outside and inside, that is, in the annular area having the outer-peripheral-edge positive and negative welding line width, the joining portion 30 where the approximately whole of the inside of the outer peripheral edge of the annular welding line group 35 is welded such that one welding line and the welding lines adjacent to this one welding line contact or overlap one another can be formed. When the above-described width of the welding line 31 varies, the maximum welding width among the widths of the welding line 31 may be employed.

The embodiment of this disclosure may be the following first to fifth welding methods and first to third joining structures.

The first welding method is a method that welds a thin metal plate and a base material using welding unit of a fiber laser, and the welding unit forms a welding line by performing continuous irradiation with laser light while moving the laser light along an annular welding schedule line and while vibrating the laser light across the welding schedule line, and an entire inside of the welding schedule line is welded.

In the second welding method according to the first welding method, the welding unit is a single-mode fiber laser.

The third welding method according to the first or second welding method includes a plurality of the welding schedule lines, and the plurality of the welding schedule lines is approximately concentrically set.

In the fourth welding method according to any of the first to third welding methods, the adjacent welding lines contact or overlap one another in a direction along the welding schedule line.

In the fifth welding method according to any of the first to fourth welding methods, the thin metal plate is coated with an insulator, and a metal exposed portion where the insulator of the thin metal plate has been removed is irradiated with the laser light.

The first joining structure is a joining structure by welding of a thin metal plate and a base material, and a joining portion of the thin metal plate and the base material includes an annular welding line group where welding lines having a predetermined length in a radial direction are arranged in a circumferential direction, and an entire inside of the joining portion is welded.

The second joining structure according to the first joining structure includes a plurality of the annular welding line groups, and the plurality of annular welding line groups is approximately concentrically arranged.

In the third joining structure according to the first or second joining structure, in the circumferential direction of the annular welding line group, the adjacent welding lines contact or overlap one another.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A welding method comprising:
   overlapping a thin metal plate with a base material, the thin metal plate being coated with an insulator, and setting an annular welding schedule line on a welding schedule portion of the thin metal plate, the welding schedule portion being a metal exposed portion where the insulator is removed;
   forming a welding line such that a continuous irradiation with a laser light from a fiber laser is performed while moving the laser light along the welding schedule line, and while vibrating the laser light across the welding schedule line; and
   setting a length of the welding line such that an entire inside of the welding schedule line is welded.

2. The welding method according to claim 1, further comprising
   using a single-mode fiber laser as the fiber laser.

3. The welding method according to claim 1, wherein:
   the setting of the welding schedule line includes coaxially setting a plurality of the welding schedule lines, and
   the setting of the length of the welding line includes setting the length of the welding line to a length to restrain a welding line of an outer welding schedule line from overlapping a welding line of an inner welding schedule line.

4. The welding method according to claim 1, wherein
   the forming of the welding line includes forming the welding line such that adjacent welding lines contact or overlap one another in a direction along the welding schedule line.

5. The welding method according to claim 1, further comprising:
   coating the thin metal plate with the insulator; and
   removing the insulator on the welding schedule portion of the thin metal plate.

* * * * *